(12) United States Patent
Kobayashi et al.

(10) Patent No.: US 10,793,771 B2
(45) Date of Patent: Oct. 6, 2020

(54) PHOSPHOR FILM

(71) Applicants: CITIZEN ELECTRONICS CO., LTD., Yamanashi-ken (JP); CITIZEN WATCH CO., LTD., Tokyo (JP)

(72) Inventors: Norihiko Kobayashi, Yamanashi-ken (JP); Hiroaki Hara, Yamanashi-ken (JP); Hiroo Kajiwara, Yamanashi-ken (JP)

(73) Assignees: CITIZEN ELECTRONICS CO., LTD., Yamanashi-Ken (JP); CITIZEN WATCH CO., LTD., Tokyo (JP)

( * ) Notice: Subject to any disclaimer, the term of this patent is extended or adjusted under 35 U.S.C. 154(b) by 360 days.

(21) Appl. No.: 15/907,387

(22) Filed: Feb. 28, 2018

(65) Prior Publication Data

US 2018/0251676 A1    Sep. 6, 2018

Related U.S. Application Data

(60) Provisional application No. 62/466,403, filed on Mar. 3, 2017.

(51) Int. Cl.
| | | |
|---|---|---|
| C09K 11/02 | (2006.01) |
| C09K 11/08 | (2006.01) |
| C09K 11/77 | (2006.01) |
| H01L 33/50 | (2010.01) |
| H01L 33/64 | (2010.01) |

(52) U.S. Cl.
CPC .......... C09K 11/02 (2013.01); C09K 11/0883 (2013.01); C09K 11/7734 (2013.01); H01L 33/501 (2013.01); H01L 33/502 (2013.01); H01L 33/641 (2013.01)

(58) Field of Classification Search
CPC .. C09K 11/02; C09K 11/0882; C09K 11/7734
See application file for complete search history.

(56) References Cited

U.S. PATENT DOCUMENTS

| | | | | |
|---|---|---|---|---|
| 3,833,398 A | * | 9/1974 | Schreurs | ............... C03C 17/007 |
| | | | | 427/67 |
| 4,350,893 A | * | 9/1982 | Takahashi | ................ G03C 5/16 |
| | | | | 250/337 |
| 4,910,407 A | | 3/1990 | Arakawa et al. | |

FOREIGN PATENT DOCUMENTS

| | | |
|---|---|---|
| JP | 2008-502131 | 1/2008 |
| WO | 2005/119797 | 12/2005 |

* cited by examiner

*Primary Examiner* — C Melissa Koslow
(74) *Attorney, Agent, or Firm* — Wenderoth, Lind & Ponack, L.L.P.

(57) ABSTRACT

A phosphor film includes phosphor particles, a thermally-conductive filler, and a binder bonding the phosphor particles and the thermally-conductive filler together. The thermally-conductive filler includes glass particles and/or alumina particles. A weight ratio of a weight of the binder to a total weight of the phosphor particles and the thermally-conductive filler is in a range of 0.1 wt % to 5.0 wt %.

10 Claims, 3 Drawing Sheets

PHOSPHOR FILM

CROSS-REFERENCE TO RELATED APPLICATION

The present application is based on and claims benefit of U.S. provisional application No. 62/466,403 filed on Mar. 3, 2017, the disclosure of which is incorporated herein by reference in its entirety.

BACKGROUND

Technical Field

The present application relates to a phosphor film, a method of producing a phosphor film, and a light-emitting device including a phosphor film.

Discussion of the Background

The statements in this section merely provide background information related to the present disclosure and do not necessarily constitute prior art.

JP laid-open application No. JP2008-502131 discloses a wavelength converted semiconductor light emitting device including a light emitting layer disposed between an n-type region and a p-type region that is combined with a ceramic layer which is disposed in a path of light emitted by the light emitting layer. The ceramic layer is composed of or includes a wavelength converting material such as a phosphor. Luminescent ceramic layers are less sensitive to temperature, and have low light scattering with high conversion efficiency.

U.S. Pat. No. 4,910,407 discloses a radiation image storage panel for improving the sharpness of the image provided thereby, and a process for the preparation of the same. The panel includes a support and a stimulable phosphor-containing resin layer provided thereon.

SUMMARY

A phosphor particle emits light and heat when excited by light from a light-emitting element. In at least some applications, there is a desire to release the heat that is generated from phosphor particles effectively.

Also, through a method of producing a phosphor film, if a phosphor particle contained in a binder is heated to a temperature of, for example, 400 degrees Celsius or more, the quality of the phosphor particle may be affected by the heat and/or the reaction of resin and atmospheric oxygen.

Accordingly, the inventors suggest subject matter directed to a phosphor film, a method of producing a phosphor film, and a light-emitting device including the phosphor film that take these issues into consideration.

In an aspect of the subject matter, a phosphor film includes phosphor particles, a thermally-conductive filler, and a binder bonding the phosphor particles and the thermally-conductive filler together. The thermally-conductive filler includes glass particles and/or alumina particles. And a weight ratio of a weight of the binder to a total weight of the phosphor particles and the thermally-conductive filler is in a range of 0.1 wt % to 5.0 wt %.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DETAILED DESCRIPTION OF EMBODIMENTS

Figure 1A:
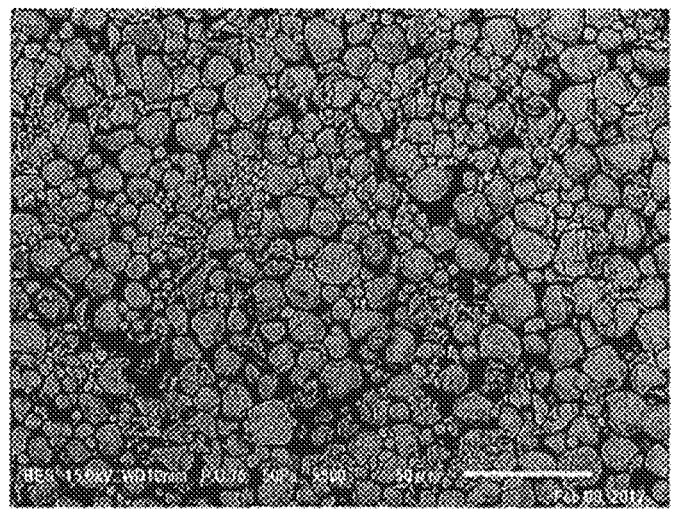
FIG. 1A is a first enlarged picture of a phosphor film including phosphor particles and a binder bonding the phosphor particles together, according to any embodiment of the present application.

Embodiments of the subject matter now will be described in further detail hereinafter with reference to the attached figures. In the figures, identical or corresponding constituents are identified using the same reference numerals, and redundant description is omitted. Also, the figures are not necessarily to scale, as the size of some of the structures or portions of the figures may be exaggerated relative to other structures or portions for illustrative purposes. Further, some of the figures are schematically illustrated to facilitate understanding of the structures represented therein.

While the specification and drawings detail certain example embodiments of the subject matter, the subject matter may, however, be embodied in many different forms and should not be construed as limited to the embodiments set forth herein. Rather, these example embodiments are provided so that this disclosure will be thorough and complete, and will fully convey the scope of the subject matter to those skilled in the art.

As used herein, the term "and/or" includes any and all combinations of one or more of the associated listed items. The terminology used herein is for the purpose of describing particular example embodiments only and is not intended to be limiting of the subject matter. As used herein, the singular forms "a", "an" and "the" are intended to include the plural forms as well, unless the context clearly indicates otherwise. Relative terms such as "below" or "above" or "upper" or "lower" may be used herein to describe a relationship of one element, layer or region to another element, layer or region as illustrated in the figures. It will be understood that these terms are intended to encompass different orientations of a device in addition to the orientation depicted in the figures.

According to a first aspect of the subject matter, a phosphor film includes phosphor particles; and a binder bonding the phosphor particles together, and the phosphor film has a thickness that is in a range of 20 μm to 50 μm.

A phosphor film without containing thermally-conductive fillers may have an increased density of the phosphor particles in the phosphor film. Accordingly, the phosphor film may have a thickness that is in a range of 20 μm to 50 μm to pass light from a light source through the phosphor film.

According to a second aspect of the subject matter, a phosphor film includes phosphor particles; and a thermally-conductive filler; and a binder bonding the phosphor particles and the thermally-conductive filler together. The phosphor film according to the second aspect of the subject matter has a thickness that is in a range of 100 µm to 300 µm.

According to a third aspect of the subject matter, a phosphor film includes phosphor particles; and a binder bonding the phosphor particles together. The phosphor film according to the third aspect of the subject matter has a thickness that is in a range of 20 µm to 300 µm.

According to a fourth aspect of the subject matter, a method of producing a phosphor film includes preparing phosphor particles; preparing a binder that is in a liquid state; adding the binder that is in the liquid state to the phosphor particles to form a mixture of the phosphor particles and the binder; and compressing the mixture of the phosphor particles and the binder to form a phosphor film that has a thickness in a range of 20 µm to 50 µm.

According to a fifth aspect of the subject matter, a method of producing a phosphor film includes preparing phosphor particles; preparing glass particles and/or alumina particles; preparing a binder that is in a liquid state; adding the binder that is in the liquid state to the phosphor particles and the glass particles and/or alumina particles to form a mixture of the phosphor particles, the glass particles and/or alumina particles, and the binder; and compressing the mixture of the phosphor particles, the glass particles and/or alumina particles, and the binder in the liquid state to form a phosphor film that has a thickness in a range of 100 µm to 300 µm.

FIG. 1A is a first enlarged picture of a phosphor film including phosphor particles and a binder bonding the phosphor particles together, according to any embodiment of the present application. The phosphor particles in FIG. 1A, as an example of phosphor particles, are cerium-doped lutetium aluminum garnet phosphor particles that are bonded together by a binder.

Figure 1B:
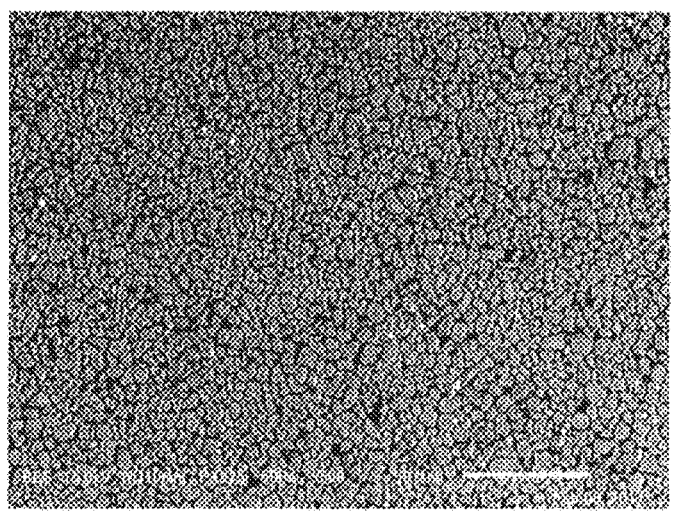
FIG. 1B is a second enlarged picture of a phosphor film including phosphor particles and a binder bonding the phosphor particles together, according to any embodiment of the present application.

FIG. 1B is a second enlarged picture of a phosphor film including phosphor particles and a binder bonding the phosphor particles together, according to any embodiment of the present application. The phosphor particles in FIG. 1B, as an example of phosphor particles, are phosphor particles including a chemical compound represented by a formula of $CaAlSiN_3$:Eu. The phosphor particles are bonded together by a binder.

Figure 1C:
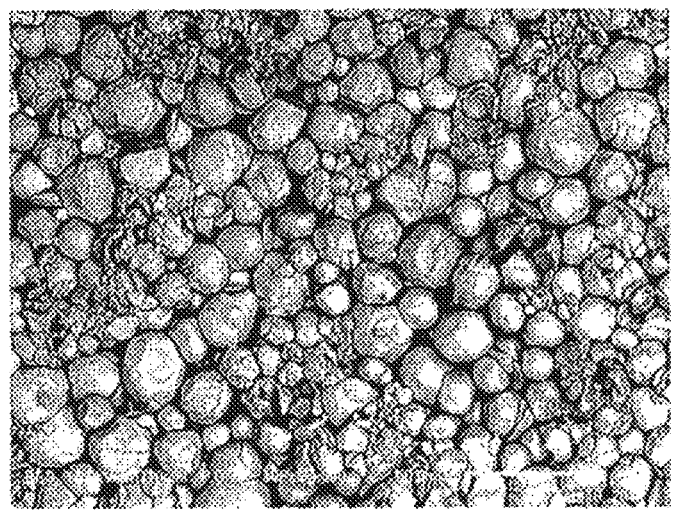
FIG. 1C is a third enlarged picture of a phosphor film including phosphor particles and a binder bonding the phosphor particles together, according to any embodiment of the present application.

FIG. 1C is a third enlarged picture of a phosphor film including phosphor particles and a binder bonding the phosphor particles together, according to any embodiment of the present application. The phosphor particles in FIG. 1C, as an example of phosphor particles, are yttrium aluminum garnet (YAG) phosphor particles. The phosphor particles are bonded together by a binder.

Various phosphors are available, and a phosphor film according to the subject matter may contain phosphor particles selected from one or more phosphors and/or a desired combination thereof.

The phosphor film according to the subject matter may contain phosphor particles that tend to be susceptible to heat, because the phosphor film does not require sintering, which often tends to cause a deterioration of phosphor quality and/or a thermal reaction of the binder.

In a first embodiment according to the present application, a phosphor film may include phosphor particles and a binder bonding the phosphor particles together, and the phosphor film may have a thickness that is in a range of, for example, 20 µm to 50 µm.

A weight ratio of the weight of the binder to the weight of the phosphor particles may be in a range of 0.1 wt % to 5.0 wt %.

Figure 2:
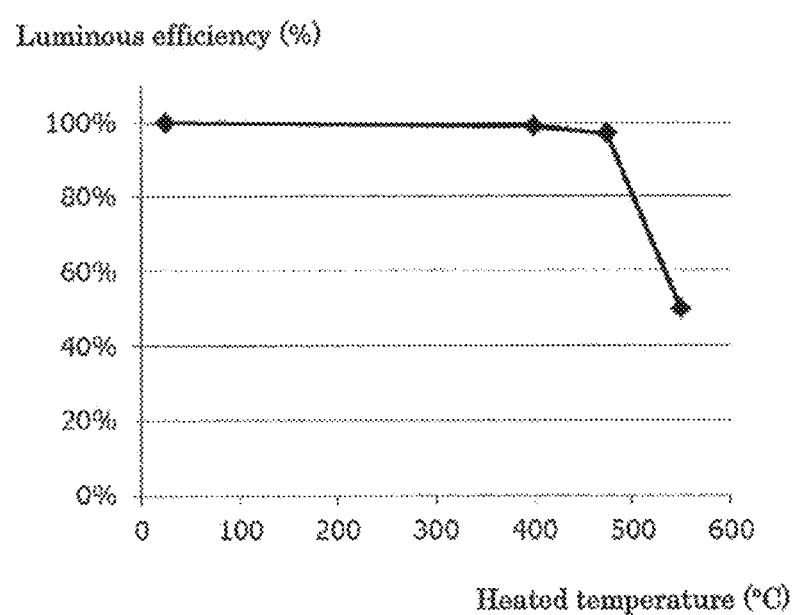
FIG. 2 is a chart to show a relationship of luminous efficiency of phosphor particles and temperature.

The phosphor particles may be arranged without a gap in a plan view and also in a side plan view. The phosphor particles are adhered to one another by a small amount of binder and are in close contact with one another to form a thin phosphor film. The phosphor particles, which tend to be more thermally-conductive than the binder, may function as heat dissipator of the phosphor film. Furthermore, the phosphor particles are free from sintering. Accordingly, the phosphor film of the subject matter may have an advantage in heat dissipation FIG. 2 is a chart showing a relationship of luminous efficiency of phosphor particles and temperature. This chart shows that when a phosphor particle contained in a binder is heated to a high temperature of, for example, 400 degrees Celsius or more, the quality (e.g., luminous efficiency) of the phosphor particle may be affected by the heat and/or the reaction of resin and atmospheric oxygen.

A sintering temperature of phosphor particles is usually higher than 400 degrees Celsius, and thus, a phosphor film that is produced without sintering may have an advantage in the quality of the phosphor particles.

In a second embodiment according to the present application, a phosphor film may include phosphor particles, a thermally-conductive filler, and a binder bonding the phosphor particles and the thermally-conductive filler together.

In phosphor films formed by compressing phosphor particles, for ensuring sufficient wavelength conversion efficiency and film transparency, a thickness of a single phosphor film can be, for example, in a range of 20 µm to 50 µm. However, a phosphor film having a thickness in the range of 20 µm to 50 µm may be insufficient for handling the film without breaking.

In the second embodiment, the phosphor film containing thermally-conductive filler may have an increased thickness that is in a range of, for example, 100 µm to 300 µm. The phosphor film with such increased thickness may be easier to handle while ensuring sufficient wavelength conversion efficiency and film transparency. Also, the phosphor film can include, for example, phosphor particles of 10 to 20 volume % against the whole volume.

The thermally-conductive filler, which may function as a heat dissipator, may be glass particles and/or alumina particles.

In this embodiment, a weight ratio of the weight of the binder to a total weight of the phosphor particles and the thermally-conductive filler may be in a range of 0.1 wt % to 5.0 wt %.

The binder may be a resin and may start to cure at a temperature that is in a range of, for example, 20 degrees Celsius to 300 degrees Celsius. Also, the binder may be a resin that may be cured by ultraviolet light with a wavelength that is in a range of 350 nm to 450 nm, for example. Accordingly, the phosphor particles are free from sintering.

In the second embodiment, the phosphor particles may include, but are not limited to, cerium-doped lutetium aluminum garnet phosphor particles. The phosphor particles also may include a chemical compound such as one represented by a formula of $CaAlSiN_3$:Eu, but are not limited to this.

In a third embodiment according to the present application, a phosphor film includes phosphor particles and a binder bonding the phosphor particles together. The phosphor film can have a thickness that is in a range of, for example, 20 µm to 300 µm. A weight ratio of the weight of the binder to the weight of the phosphor film may be in a range of 0.1 wt % to 5.0 wt %. The phosphor particles are free from a phosphor particle that is sintered.

Although not limited to using silicon resin, in some embodiments in the present application, silicon resin may be used as thermosetting resin. Such resin cures in a relatively short time at 80 degrees Celsius or more. For industrial applications, it is possible to cure such thermosetting resin at, for example, about 150 degrees Celsius. However, such resin starts to cure at about 20 degrees Celsius if it is possible to allow the resin to cure over a long period of time. Also, curing such thermosetting resin at, for example, 300 degrees Celsius or lower prevents the resin from decomposing.

Although not limited thereto, in some embodiments in the present application, an epoxy resin may be used as ultraviolet curing resin.

A method of producing a phosphor film according to the first embodiment of the present application may include: preparing phosphor particles; preparing a binder that is in a liquid state; adding the liquid state binder to the phosphor particles to form a mixture of the phosphor particles and the binder; and compressing the mixture of the phosphor particles and the binder to form a phosphor film that has a thickness in a range of, for example, 20 μm to 50 μm. The method may further include solidifying the phosphor film at a temperature that is in a range of, for example, 20 degrees Celsius to 300 degrees Celsius. The method of producing a phosphor film may further include curing the phosphor film by ultraviolet light with a wavelength that is in a range of, for example, 350 nm to 450 nm. The method does not include sintering the phosphor particles.

A method of producing a phosphor film according to the second embodiment of the present application includes: preparing phosphor particles; preparing glass particles and/or alumina particles; preparing a binder that is in a liquid state; adding the liquid state binder to the phosphor particles and the glass particles and/or alumina particles to form a mixture of the phosphor particles, the glass particles and/or alumina particles, and the binder; and compressing the mixture of the phosphor particles, the glass particles and/or alumina particles, and the liquid state binder to form a phosphor film that has a thickness in a range of, for example, 100 μm to 300 μm.

The method may further include solidifying the phosphor film at a temperature that is in a range of, for example, 20 degrees Celsius to 300 degrees Celsius. Furthermore, the method may include curing the phosphor film by ultraviolet light with a wavelength that is in a range of, for example, 350 nm to 450 nm. Since the method does not require sintering the phosphor particles, the phosphor film of the subject application is formed without causing a deterioration of phosphor quality and/or a thermal reaction of the binder, which often tends to occur when phosphor particles are sintered.

A phosphor film may be formed in a film shape with opposite flat surfaces. Also, the phosphor film may be formed to include a convex surface. It is possible to compress the phosphor particles and the binder, which bonds the phosphor particles together, in a die bond to form a phosphor film with a convex surface and/or a lens surface, for example.

Figure 3A:
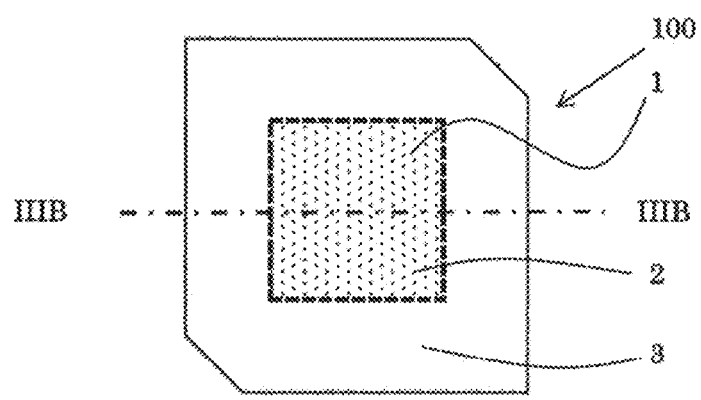
FIG. 3A is a light-emitting device including a phosphor film according to any embodiment of the present application.
Figure 3B:
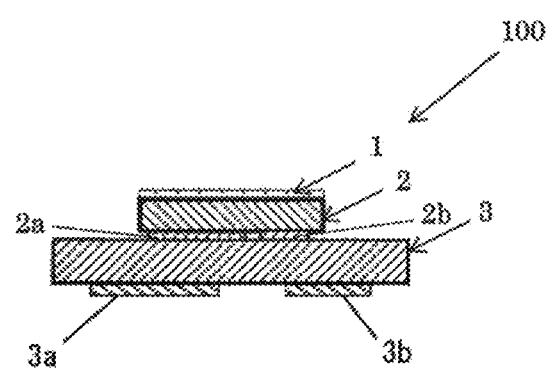
FIG. 3B is a cross-sectional view of a light-emitting device, taken along a dot and dash line IIIB of FIG. 3A.

A light-emitting device including a phosphor film according to any embodiment of the present application will be described with reference to FIG. 3A and FIG. 3B. A light-emitting device 100 includes a phosphor film 1 according to the subject matter and a light-emitting element 2. The phosphor film 1 may be positioned to receive light from the light-emitting element 2. The phosphor film 1 may be arranged on the light-emitting element 2. The light-emitting device 100 may also include an electrically-insulating body 3 including a first electrode 3a and a second electrode 3b. The electrically-insulating body 3 may be a substrate. The light-emitting element 2 may include a first element electrode 2a that may be electrically connected to the first electrode 3a and a second element electrode 2b that may be electrically connected to the second electrode 3b.

Also, the electrically-insulating body 3 may be a resin body in which a first lead and a second lead may be partly embedded. The first element electrode 2a of the light-emitting element 2 may be electrically connected to the first lead (not illustrated), and the second element electrode 2b of the light-emitting element 2 may be electrically connected to the second lead (not illustrated).

Various light-emitting devices may include a phosphor film and a light-emitting element. Furthermore, while certain embodiments of the present application have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:

1. A phosphor film comprising:
   phosphor particles;
   a thermally-conductive filler comprising glass particles and/or alumina particles; and
   a binder bonding the phosphor particles and the thermally-conductive filler together,
   wherein the binder is a thermosetting resin and starts to cure at a temperature that is in a range of 20 degrees to 300 degrees, and
   wherein a weight ratio of a weight of the binder to a total weight of the phosphor particles and the thermally-conductive filler is in a range of 0.1 wt % to 5.0 wt %.

2. The phosphor film according to claim 1,
   wherein the phosphor film has a thickness that is in a range of 100 μm to 300 μm.

3. The phosphor film according to claim 1,
   wherein the phosphor particles comprise cerium-doped lutetium aluminum garnet phosphor particles.

4. The phosphor film according to claim 1,
   wherein the phosphor particles comprise a chemical compound with a formula of $CaAlSiN_3$:Eu.

5. The phosphor film according to claim 1,
   wherein the phosphor particles are free from a phosphor particle that is sintered.

6. A phosphor film comprising:
   phosphor particles;

a thermally-conductive filler comprising glass particles and/or alumina particles; and a binder bonding the phosphor particles and the thermally-conductive filler together, wherein the binder is a ultraviolet curing resin and is cured by ultraviolet light with a wavelength that is in a range of 350 nm to 450 nm, and wherein a weight ratio of a weight of the binder to a total weight of the phosphor particles and the thermally-conductive filler is in a range of 0.1 wt % to 5.0 wt %.

7. The phosphor film according to claim 6,
wherein the phosphor film has a thickness that is in a range of 100 μm to 300 μm.

8. The phosphor film according to claim 6,
wherein the phosphor particles comprise cerium-doped lutetium aluminum garnet phosphor particles.

9. The phosphor film according to claim 6,
wherein the phosphor particles comprise a chemical compound with a formula of $CaAlSiN_3:Eu$.

10. The phosphor film according to claim 6,
wherein the phosphor particles are free from a phosphor particle that is sintered.

\* \* \* \* \*